United States Patent [19]

Pliefke

[11] Patent Number: 4,840,709
[45] Date of Patent: Jun. 20, 1989

[54] SINGLE-STAGE ELECTROCHEMICAL IMAGE-FORMING PROCESS FOR REPRODUCTION LAYERS

[75] Inventor: Engelbert Pliefke, Wiesbaden, Fed. Rep. of Germany

[73] Assignee: Hoechst Aktiengesellschaft, Frankfurt am Main, Fed. Rep. of Germany

[21] Appl. No.: 198,308

[22] Filed: May 25, 1988

[30] Foreign Application Priority Data

May 26, 1987 [DE] Fed. Rep. of Germany ....... 3717652

[51] Int. Cl.$^4$ .............................................. C25D 9/02
[52] U.S. Cl. ........................................ 204/2; 204/33; 204/56.1
[58] Field of Search ................... 204/2, 15, 33, 56.1

[56] References Cited

U.S. PATENT DOCUMENTS

| | | | |
|---|---|---|---|
| 3,085,051 | 4/1963 | Hamm et al. | 204/18 |
| 3,095,808 | 7/1960 | Eastman | 101/149.2 |
| 3,106,155 | 10/1963 | Eastman et al. | 101/149.1 |
| 3,106,157 | 10/1963 | Reithel | 101/149.2 |
| 3,654,095 | 4/1972 | Koonte | 204/2 |
| 4,086,853 | 5/1978 | Figov et al. | 101/463 |
| 4,376,814 | 3/1983 | Walls | 430/272 |
| 4,383,897 | 5/1983 | Gillich et al. | 204/33 |
| 4,519,876 | 5/1985 | Lee et al. | 204/15 |

FOREIGN PATENT DOCUMENTS

| | | |
|---|---|---|
| 0030642 | 6/1981 | European Pat. Off. |
| 0155231 | 9/1985 | European Pat. Off. |
| 3305355 | 10/1986 | Fed. Rep. of Germany |
| 51-78406 | 7/1976 | Japan |
| 1490732 | 11/1977 | United Kingdom |

Primary Examiner—T. M. Tufariello
Attorney, Agent, or Firm—Foley & Lardner, Schwartz, Jeffery, Schwaab, Mack, Blumenthal & Evans

[57] ABSTRACT

This invention relates to a single-stage process for imaging an electrically conductive substrate by the action of electric current, wherein the substrate is brought into contact with an electrically conductive solution of an organic substance, a direct voltage is applied between the substrate and at least one electrode, and the organic substance is deposited imagewise by current impulses, at a current density from 0.01 to 100 A/dm$^2$. The organic substances used preferably comprise polymers.

22 Claims, 1 Drawing Sheet

SINGLE-STAGE ELECTROCHEMICAL IMAGE-FORMING PROCESS FOR REPRODUCTION LAYERS

BACKGROUND OF THE INVENTION

The present invention relates to a single-stage imaging process for printing plates and printed circuit boards, in an aqueous electrolyte solution.

In the preparation of offset printing plates or photoresists (both referred to hereinafter as copying materials) radiation-sensitive (light-sensitive) reproduction layers are used, which, in general, are applied to a support by the customer or industrial manufacturer. The layer supports used in such copying materials include metals such as zinc, magnesium, chromium, copper, brass, steel, silicon, aluminum or combinations of these metals, plastic films, paper or similar materials. These supports can be coated with the radiation-sensitive reproduction layer without a modifying pretreatment, but preferably after carrying out a surface modification such as mechanical, chemical and/or electrochemical graining, surface oxidation and/or treatment with agents which impart hydrophilicity (for example, in the case of supports for offset printing plates). In addition to at least one radiation-sensitive compound, the conventional radiation-sensitive reproduction layers usually also contain an organic binder (e.g., resins) and, optionally, also plasticizers, pigments, dyes, surfactants, sensitizers, adhesion promoters, indicators and other customary auxiliary agents. In order to produce an image from these reproduction layers, the layers are developed after their irradiation (exposure) to obtain, for example, a printing form or a photoresist. In the case of electrophotographic layers, the step of decoating corresponds to the developing step. Within the scope of this invention, the term "reproduction layers" also includes layers that do not contain a radiation-sensitive compound, but contain the other above-mentioned components, i.e., in particular an organic binder.

The prior art has disclosed processes, in which it is possible to produce a printing form without an irradiation and/or developing step and thus without using the customary reproduction layers containing a radiation-sensitive compound.

German patent No. 24 33 448 (=U.S. Pat. No. 4,086,853) discloses the use of an electroresponsive recording blank comprising: (a) a hydrophobic underlayer (for example, of polyester), (b) an electrically conductive hydrophilic layer (for example, of aluminum) arranged thereon, which can be locally removed by the action of current by means of a stylus, and (c) a layer (composed, for example, of a cellulose derivative, a plasticizer and a pigment) which, as a result of the action of electric current, can be removed from layer (b).

German Offenlegungsschrift No. 25 14 682 (=British patent No. 1,490,732) describes the use of an electroresponsive recording material comprising (a) an electrically conductive oleophilic layer which cannot be removed by the action of electric current and (b) an oleophobic silicone rubber layer arranged thereon which can be locally removed by the action of current by means of a stylus.

Furthermore, European Patent Application No. 0,030,642 discloses a process for producing, by electro-erosion, a printing form from a sheet-like material, comprising (a) a hydrophobic substrate layer (for example, of polyester), a hydrophilic, electrically conductive intermediate layer (for example, of aluminum) and (c) a protective dielectric top layer (for example, of $Al_2O_3$), in which process both layers (c) and (b) are removed due to the action of electrodes.

These prior art processes are based on an imagewise removal of layer components by electrochemical degradation.

European patent application No. 0,155,231 describes electro dipcoating of a printed circuit board that, after coating, is processed by imagewise exposure and development.

According to European patent No. 0,089,510 (=U.S. Pat. No. 4,376,814) a hydrophilic polymer is electrochemically deposited on a printing plate.

In the two processes, polymers are deposited by electro dipcoating, but imagewise differentiation is not used.

Imagewise differentiation is described in the following publications:

U.S. Pat. No. 4,519,876 discloses an electrically conductive substrate carrying an insulating layer which can be removed imagewise after exposure to laser energy. Thereafter, metal is electrolytically deposited in the exposed regions which are no longer protected.

In Japanese Patent Application Disclosure No. 51-078,406 an analogous process is described, in which a screen printing mask is used as an original and metal is electrodeposited in the uncovered portions of the screen.

In addition, the patent literature has disclosed processes wherein deposits are produced by an electrophotographic route or by means of conductivity patterns.

U.S. Pat. Nos. 3,106,157 and 3,085,051, for example, describe processes in which the conductivity pattern produced by imagewise exposure serves to deposit indium or nickel atoms.

U.S. Pat. No. 3,095,808 describes the use of photoconductivity after imagewise exposure for depositing a Fe, Cu, Ni or Co salt of rubeanic acid.

According to U.S. Pat. No. 3,106,155 a photoconductivity pattern created by imagewise exposure is "developed", by means of polymers, for example, by cellulose acetate phthalate.

In all these processes imagewise exposure must first be carried out to produce a conductivity pattern which is fixed in further process steps.

SUMMARY OF THE INVENTION

It is an object of the present invention to provide a process, in which imagewise differentiation is achieved by simple means.

It is a further object of the present invention to provide a process in which imagewise differentiation is achieved without a mask.

It is yet another object of the present invention to provide a process in which imagewise differentiation is achieved without imagewise exposure.

These and other objects have been achieved according to the invention by a process for electrochemical image formation on an electrically conductive substrate by the action of electric current, comprising the steps of contacting the substrate with an electrically conductive solution or dispersion (in the following simply called "solution") of an organic substance, applying a direct voltage between the substrate and at least one electrode, for example, by guiding the electrode over the surface of the substrate, and depositing the organic substance by current impulses, at a current density from about 0.01 to 100 A/dm$^2$.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
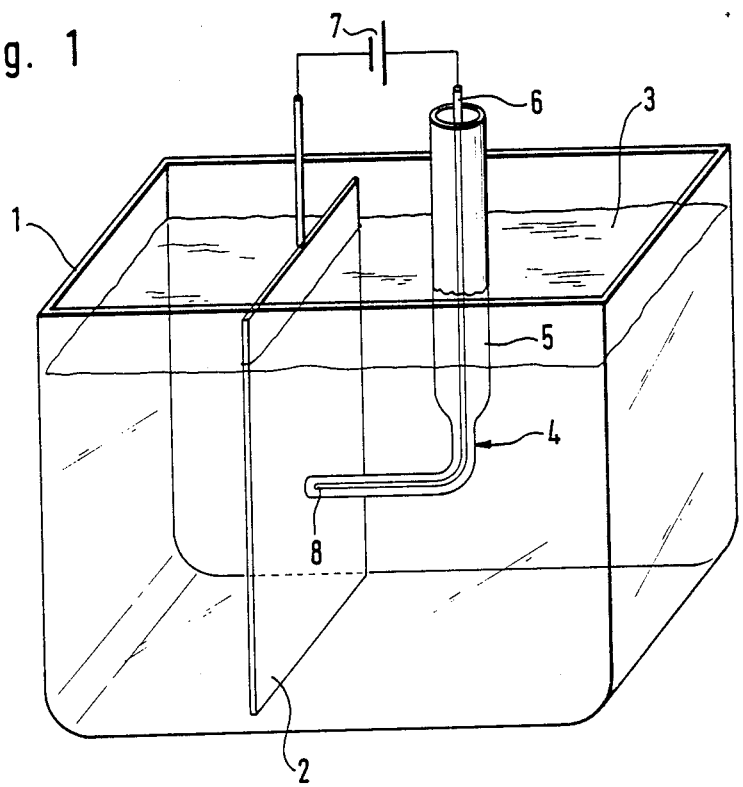
FIG. 1 shows a first embodiment of the present invention.

The process of the present invention is based on the electro dipcoating process and on the processes used in lithography for the additive correction of exposed and developed printing plates or printed circuit boards by currentless, imagewise application of a varnish or resin in places that were initially not reproduced in the original. In electro dipcoating, current is applied in an aqueous electrolyte system and thus an initially dissolved organic substance is either cathodically or anodically deposited on the workpiece to be coated. The present invention is characterized in that these organic compounds, preferably polymers, are deposited imagewise in the additive correction of printing plates or printed circuit boards, under the action of electric current.

One practicable embodiment of this invention comprises, in the simplest case, a stylus-type electrode which is guided at the smallest possible distance from the plate to be imaged. By a short current impulse, it is possible to induce, on the plate, a punctiform deposit of an organic compound from the electro immersion bath. By the cyclic repetition of this procedure an entire (printing) plate can be imaged according to a screen pattern.

For example, by continuously passing over the corresponding plate regions solid areas can also be produced without difficulty.

Another, more rapidly performed embodiment comprises using a mask, i.e., imagewise depositing is effected through holes in a sheet arranged in front of the plate to be imaged, the subsequent image areas being formed at the holes. The electro dipping varnish is then selectively deposited in those areas where the plate to be imaged is not covered.

Instead of a mask held in front of the plate to be imaged it is, of course, also possible to use an imaged and developed printing plate for the inventive step. By electro dipcoating, the substances to be applied are then deposited in the original nonimage areas. After removal of the original image areas an image-reversed plate is obtained. An originally positive printing form is thus converted into a negative printing form, and vice versa.

The process according to the invention has, in the embodiment comprising the stylus-type electrode, the advantage that digitally stored information can be read directly out of a computer and converted, on the spot, into a printing form or a printed circuit pattern.

In the other embodiments, dot rendering, ink receptivity and length of print run can be markedly improved by appropriately selecting the resin deposited. The process of the invention, in fact, permits optimum anchoring of the layer since its capability of being subsequently developed, which is obligatory in normal printing plates, can be eliminated.

In contrast to the imagewise metal deposition cited as the prior art, the process of this invention for imagewise electro dipcoating with an organic resin yields a compact layer even at very low amounts of charge; by appropriately selecting the organic substance it is, in addition, possible to achieve a balance between constant ink flow and print run stability, which is ideally adapted for printing forms.

According to the process of the invention it is thus possible to deposit imagewise various types of resins from aqueous solutions that do not have to contain an organic solvent or other relatively large amounts of polluting auxiliary agents. The degree of resolution obtainable in this process corresponds to that of conventional plates which have been imaged non-electrochemically, i.e., by irradiation, and then developed.

The concentration of the aqueous resin solution may range from about 0.1% by weight, in particular about 1% by weight, to the particular saturation concentration of the dissociated compound. Concentrations of up to about 20% by weight are generally sufficient. If the concentration of the aqueous electrolyte is below about 0.1% by weight, the conductivity of the solution is usually too low, so that the resulting current density becomes too low to achieve sufficiently rapid imaging by electro dipcoating. The temperature of the aqueous electrolyte may range from room temperature up to the boiling point of the electrolyte system, a temperature of about 20° C. to 70° C. being preferably maintained. Agitation of the aqueous electrolyte while the process of the invention is being carried out is generally not necessary. For a simple imaging process it can also be advantageous to operate with a highly thickened electrolyte system.

The process according to the invention is carried out using direct current, optionally modulated d.c., and it is also possible to use pulsed direct current. In the process, current density can, in principle, be outside a range of about 0.01 to 100 A/dm$^2$, but this range is preferable, since otherwise the aqueous electrolyte solution is heated to too great an extent or the rate of deposition becomes too low and/or the duration or quality of image formation can be adversely affected. The current density rises at the beginning of the electrochemical imaging process, remains for a certain time at one level and drops again markedly towards the end of the treatment.

When cathodic deposition is employed, hydrogen is evolved at the cathode during the electrochemical imaging process, by discharge of $H^+(H_3O^+)$ ions. It is assumed that, as a result of this, the local pH strongly increases and effects the imagewise differentiating deposition. Analogously, deposition occurs by a decrease of the pH in the anodic imagewise electro dipcoating process.

The term "stylus-type electrode" refers to an oblong or elongated body that is made of a material that is as inert as possible (i.e., is not attacked during the process of the invention), such as special steel, graphite, gold or platinum and that has the smallest possible tip in order to achieve a very good resolution and very fine image dots. This electrode or these electrodes are guided over the sheet-like material to be imaged at a distance which is as small as possible.

The process of the invention is explained with reference to the accompanying figures, without being limited to the embodiments shown.

FIG. 1 shows a possible embodiment. Plate 2 which is to be provided with an image is immersed into an appropriate solution 3 of an electro dipping varnish present in container 1. Stylus electrode 4 is guided at a small distance from plate 2. Stylus electrode 4 comprises a jacket of insulating material 5 (e.g., glass, plastics, etc.), through which conductive wire 6 of an inert material passes, the insulating jacket of stylus electrode 4 being optionally also filled with the electro dipcoating solution. Between plate 2 and the stylus electrode 4, voltage 7 is applied, which causes the varnish to deposit imagewise directly at electrode tip 8.

For the imaging of relatively large surfaces or for an acceleration of the process, it is also possible to use several stylus-type electrodes. Like a single electrode, these electrodes are controlled by a device wherein the image information is stored in a digitized form (for example, "computer-to-plate" system). The substrate which is to be provided with an image represents the counter-electrode.

Figure 2:
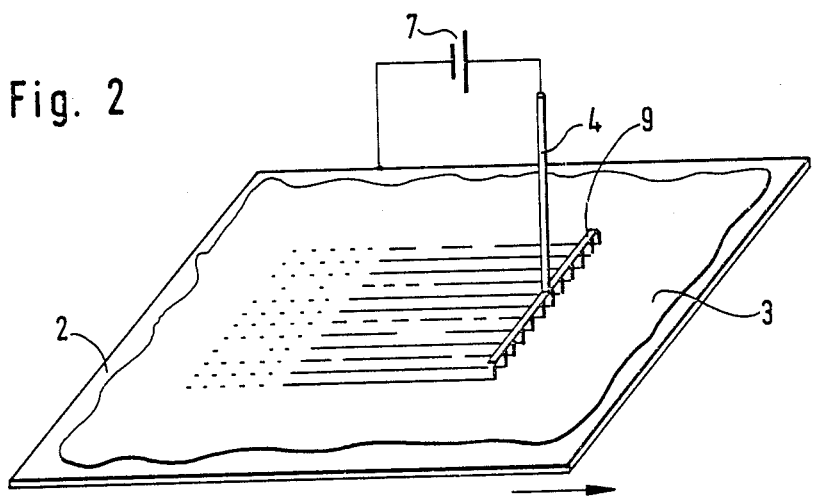
FIG. 2 shows a second embodiment of the present invention.

Details of this embodiment are shown in FIG. 2. Plate 2 to be imaged is coated with solution 3 of an electro dipping varnish which is preferably in the form of a gel and into which a number of stylus electrodes 4 are immersed. The electrodes are electrically insulated with respect to each other and can be individually contacted. When current, is applied to one stylus in the block 9, a varnish deposit corresponding to the current flow is formed in that place.

Relative to the material which is to be imaged and to the stylus-type electrode(s), the aqueous electrolyte solution must be arranged in such a way that it can cause an imagewise deposition of the reproduction layer as a result of the interaction with the two elements acting as electrodes, that is achieved, for example, by immersing the elements into the solution. In accordance with the process of this invention reproduction layers do not only include the conventional, known radiation-sensitive layers described below, but also layers of similar composition, but that do not contain a radiation-sensitive compound. In general, the term "reproduction layers" refers to any layers which, in the process of this invention, make it possible to obtain an imagewise differentiation.

In a preferred embodiment of the process according to the present invention, the substrate that is to be provided with an image is contacted with the electrolyte solution containing a binder by immersion. In this step, one edge of the sheet-like material should project from the surface of the electrolyte bath, so that a current supply can be connected to this part. Another possibility of supplying current is by contacting via the back of the material. The stylus-type electrode should in particular be disposed at a uniform distance from the sheet-like substrate, so that a uniform current density can be achieved in each place of the sheet-like material to be imaged. The process offers the advantage that, due to dot-wise production of the image areas, the size of the latter can be controlled by varying current density and time. The triggers can be generated, for example, directly by a computer-to-plate system. The uncoated back of the sheet-like substrate to be treated should preferably rest against a non-conductive material in order to avoid unnecessary consumption of electric energy. Another possibility is to seal off the back of the material; the plate is then guided in tight grooves in the container of the electrolyte bath. Furthermore, it is expedient to insulate the predominant portion of the stylus-type electrode(s).

The reproduction layer to be produced according to the present invention generally contains a polymeric binder that, under the action of the electric current, is deposited imagewise by means of the stylus-type electrode(s). However, the invention also includes deposits based on a polymeric binder, which contain a radiation-sensitive compound, but preferentially they are employed as radiation-sensitive layers. Suitable substrates comprise electrically conductive support materials including, for example, supports which comprise layers of zinc, chromium, magnesium, copper, brass, steel, silicon, aluminum or alloys or combinations of these metals. These support materials can be electrochemically imaged by means of a suitable reproduction layer without any special modifying pretreatment, but preferably imaging is carried out only after a modifying surface treatment such as a mechanical, chemical or electrochemical graining treatment, an oxidation and/or treatment with agents imparting hydrophilicity (in particular in the case of supports for offset printing plates).

Particularly suitable substrates for the preparation of offset printing plates include those made of aluminum or one of its alloys, that, for example, have an aluminum content of more than 98.0% by weight, and in particular of more than about 98.5% by weight, and additionally contain Si, Fe, Ti, Cu, Zn, Mn and/or Mg constituents.

Aluminum support materials for printing plates, which are very common in practice, are generally grained before application of the reproduction layer. Graining may be effected mechanically (for example, by brushing and/or by treatment with abrasive agents), chemically (for example, by means of etching agents) or electrochemically (for example, by treatment with alternating current in aqueous HCl or $HNO_3$ solutions). The mean peak-to-valley height $R_z$ of the grained surface is in the range from about 1 $\mu$m to 15 $\mu$m, in particular from about 1.5 $\mu$m to 10 $\mu$m. The peak-to-valley height is determined according to DIN 4768, in the October 1970 version, the peak-to-valley-height $R_z$ is then the arithmetic mean calculated from the individual peak-to-valley height values of five mutually adjacent individual measurement lengths.

Prior to graining, the aluminum can be subjected to a precleaning treatment; precleaning includes, for example, treatment with an aqueous NaOH solution with or without a degreasing agent and/or complex formers, trichloroethylene, acetone, methanol or other commercially available, so-called "aluminum pickles." Following graining or, in the case of several graining steps, between the individual steps, it is possible to perform an additional etching treatment, during which in particular a maximum amount of about 5 g/m² is removed. Etching solutions employed generally comprise aqueous alkali metal hydroxide solutions or aqueous solutions of salts showing alkaline reactions or aqueous solutions of acids on a base of $HNO_3$, $H_2SO_4$ or $H_3PO_4$. Apart from an etching treatment step performed between the graining step and an optional subsequent anodizing step, nonelectrochemical treatments are also known, which substantially have a purely rinsing and/or cleaning effect and are, for example, employed to remove deposits which have formed during graining ("smut") or simply to remove residues from the treatment; dilute aqueous alkali metal hydroxide solutions or water are, for example, used for these treatments.

The graining process(es) is/are optionally followed by an anodic oxidation of the aluminum in a further process step, in order to improve, for example, the abrasion and adhesion properties of the surface of the support material. Conventional electrolytes, such as $H_2SO_4$, $H_3PO_4$, $H_2C_2O_4$, amidosulfonic acid, sulfosuccinic acid, sulfosalicylic acid or mixtures thereof, can be used for the anodic oxidation; particular preference is given to $H_2SO_4$ and $H_3PO_4$, which may be used alone or in a mixture and/or in a multi-stage anodizing process. The weights of the aluminum oxide layers vary from about 1 g/m$^2$ to 10 g/m$^2$, which corresponds to layer thicknesses between about 0.3 μm and 3.0 μm.

The step of performing an anodic oxidation of the aluminum support material is optionally followed by one or more post-treating steps. Post-treating is particularly understood to be a hydrophilizing chemical or electrochemical treatment of the aluminum oxide layer, for example, an immersion treatment of the material in an aqueous solution of polyvinyl phosphonic acid according to German patent No. 16 21 478 (=British patent No. 1,230,447), an immersion treatment in an aqueous solution of an alkali metal silicate according to German Auslegeschrift No. 14 71 707 (=U.S. Patent No. 3,181,461) or an electrochemical treatment (anodic oxidation) in an aqueous solution of an alkali metal silicate according to German Offenlegungsschrift No. 25 32 769 (=U.S. Pat. No. 3,902,976). These post-treatment steps serve, in particular, to improve even further the hydrophilic properties of the aluminum oxide layer, which are already sufficient for many fields of application, with the other well-known properties of the layer being at least maintained.

Suitable radiation-sensitive (photosensitive) layers include any layers which—in accordance with conventional methods which according to this invention are, however, not required—after irradiation (exposure), optionally followed by development and/or fixing, yield a surface in imagewise configuration which can be used for printing.

The light-sensitive reproduction layers include those that are, for example, described in *Light-Sensitive Systems* by Jaromir Kosar, published by John Wiley & Sons, New York, 1965: colloid layers containing chromates and dichromates (Kosar, Chapter 2); layers containing unsaturated compounds, in which, upon exposure, these compounds are isomerized, rearranged, cyclized, or crosslinked (Kosar, Chapter 4); layers containing compounds that can be photopolymerized, in which, on being exposed, monomers or prepolymers, undergo polymerization, optionally with the aid of an initiator (Kosar, Chapter 5); and layers containing o-diazoquinones, such as naphthoquinone diazides, p-diazoquinones, or condensation products of diazonium salts (Kosar, Chapter 7). The layers that are suitable also include the electrophotographic layers, i.e., layers that contain an inorganic or organic photoconductor. In addition to the radiation-sensitive substances, these layers can, of course, also contain other constituents, such as for example, resins, dyes or plasticizers.

If the above-described layers containing radiation-sensitive compounds include at least one binder, they are preferably employed without the radiation-sensitive compound in the process of this invention. The following organic polymers, which are soluble in aqueous electrolytes are then particularly suitable: polyamides, polyesters, alkyd resins, polyvinyl alcohol, polyvinyl pyrrolidone, polyethylene oxide, polyacetals, gelatin, cellulose ethers, melamine-formaldehyde resins, amino resins, acrylic resins and/or polyepoxides (e.g., on a basis of epoxidized linseed oil); it is, however, also possible to use other types of binders which are capable of being deposited in an electrolytic process. The thickness of the reproduction layer may range from about 0.1 μm to about 1 mm or more.

In those cases where the radiation-sensitive compounds contained in the reproduction layer comprise compounds which yield a negative-working system, it is expedient to subject the whole surface of the sheet-like material to a post-exposure or post-heating treatment, which is performed on that side of the material which carries the reproduction layer; positive-working systems do not require a special post-exposure.

To obtain, if necessary, even longer print runs, "baking," i.e., a thermal or comparable post-treatment of the sheet-like material, can be performed after forming an image in accordance with the invention, in order to increase the mechanical and/or chemical stability of the image areas.

Employing the process according to the invention, it is thus possible to combine the imaging and developing processes for reproduction layers, which are customarily performed in two stages, in one single stage.

In the above description and in the examples which follow, percentages relate to weight, unless otherwise stated. Parts by weight are related to parts by volume as the g is related to the cm$^3$. The reproduction layers to be treated are present on conductive supports which are—in Examples 1 to 37 —connected as the cathode in a direct current circuit, and the stylus-type electrode(s) is/are then the anode(s). In Examples 38 to 51 the substrate to be imaged is made the anode. The temperature of the electrolyte is 25° C. to 30° C. unless otherwise indicated and the distance of the material to be treated, from the counter-electrode, is kept as small as possible, without a short-circuit occurring. As a rule, the course of the current density can be described as follows: the current density first increases during a few msec to a particular value, remains for a few msec at this level and drops markedly towards the end of the electrolytic treatment. Unless specific remarks are given, the treated materials conform to customary practice.

EXAMPLES

In the following examples, the supports coated imagewise according to the process of the present invention comprise electrochemically grained and anodized aluminum sheets. The following electro dipcoating baths are used:

| | | |
|---|---|---|
| A: | 200 g | of epoxide resin ®Resydrol 16989, manufactured by Hoechst AG (60% in ethylene glycol ethyl ether) |
| | 2.75 g | of formic acid |
| | 797 ml | of water |
| B: | corresponds to A, but additionally contains | |
| | 33 g | of hardener SWX 596 |
| C: | 200 g | of epoxide resin ®Resydrol SWE 5186 |
| | 2.75 g | of formic acid |
| | 797 ml | of water |
| D: | 174 g | of epoxide resin ®Resydrol SVK 5140 (69%) |
| | 2.8 g | of formic acid |
| | 823 ml | of water |

-continued

| | | |
|---|---|---|
| E: | 182 g | of epoxide resin ® Resydrol SVK 5145 (66%) |
| | 2.75 g | of formic acid |
| | 816 ml | of water |

| Resin solutions suitable for anodic deposition | | |
|---|---|---|
| F: | 133 g | of acrylate resin ® Resydrol WY 323 (75%) |
| | 26 g | of melamine resin ® Maprenal MF 910 (90%) |
| | 12 g | of diethanolamine |
| | 1250 ml | of water |
| G: | 133 g | of melamine resin ® Resydrol WM 461 E |
| | 12 g | of diisopropanolamine |
| | 1000 ml | of water |
| H: | 171 g | of polybutadiene resin ® Resydrol SWP 195 E |
| | 17 g | of a 10% strength $NH_3$ solution |
| | 1000 ml | of water |
| I: | 200 g | of maleic acid adduct ® Resydrol SWX 213 E |
| | 20 g | of a 10% strength $NH_3$ solution |
| | 1000 ml | of water |

The deposits in image configuration can also be thermally posthardened (5 min., 100° C.) to achieve an improved anchoring.

In Examples 1 to 37 the varnishes are cataphoretically deposited and in Examples 38 to 51 anaphoretically (substrate as anode) deposited.

TABLE 1

| Example No. | Type of Electrolyte | Voltage V | Time sec | Post-Hardening | Quality of Deposit and Ink Absorption |
|---|---|---|---|---|---|
| 1 | A | 10 | 1 | — | good |
| 2 | A | 20 | 1 | — | very good |
| 3 | A | 20 | 2.5 | — | very good |
| 4 | A | 20 | 5 | — | very good |
| 5 | A | 40 | 2.5 | — | very good |
| 6 | A | 40 | 5 | — | very good |
| 7 | A | 60 | 1 | — | very good |
| 8 | A | 60 | 3 | — | very good |
| 9 | A | 60 | 5 | — | very good |
| 10 | A | 80 | 0.1 | — | very good |
| 11 | A | 80 | 1 | — | very good |
| 12 | A | 100 | 0.01 | — | very good |
| 13 | A | 100 | 0.1 | — | very good |
| 14 | A | 100 | 1 | — | very good |
| 15 | A | 200 | 0.001 | — | very good |
| 16 | A | 200 | 0.01 | — | very good |
| 17 | A | 200 | 0.1 | — | very good |
| 18 | A | 200 | 1 | — | very good |
| 19 | B | 10 | 5 | — | very good |
| 20 | B | 20 | 1 | — | very good |
| 21 | B | 20 | 2.5 | — | very good |
| 22 | B | 20 | 5 | — | very good |
| 23 | B | 40 | 2.5 | — | very good |
| 24 | B | 40 | 5 | — | very good |
| 25 | C | 20 | 5 | — | good |
| 26 | C | 20 | 10 | — | good |
| 27 | C | 40 | 2.5 | — | good |
| 28 | C | 40 | 5 | — | good |
| 29 | D | 10 | 1 | — | very good |
| 30 | D | 10 | 10 | — | very good |
| 31 | D | 20 | 10 | — | very good |
| 32 | D | 40 | 1 | — | very good |
| 33 | E | 10 | 1 | — | very good |
| 34 | E | 20 | 15 | — | very good |
| 35 | E | 30 | 20 | — | very good |
| 36 | E | 40 | 10 | — | very good |
| 37 | E | 40 | 15 | — | very good |
| 38 | F | 40 | 30 | yes | very good |
| 39 | G | 40 | 1 | yes | very good |

TABLE 1-continued

| Example No. | Type of Electrolyte | Voltage V | Time sec | Post-Hardening | Quality of Deposit and Ink Absorption |
|---|---|---|---|---|---|
| 40 | G | 40 | 5 | yes | very good |
| 41 | G | 60 | 0.5 | yes | very good |
| 42 | G | 60 | 1 | yes | very good |
| 43 | G | 210 | 0.001 | yes | very good |
| 44 | G | 210 | 0.01 | yes | very good |
| 45 | G | 210 | 0.1 | yes | very good |
| 46 | G | 210 | 1 | yes | very good |
| 47 | H | 200 | 5 | yes | very good |
| 48 | I | 20 | 15 | yes | good |
| 49 | I | 30 | 15 | yes | very good |
| 50 | I | 40 | 2 | yes | very good |
| 51 | I | 80 | 1 | yes | very good |

The following Table 2 indicates the print runs obtained with printing plates prepared according to some of the above-described examples.

TABLE 2

| Example No. | Print Run in Thousands |
|---|---|
| 2 | 80 |
| 29 | 100 |
| 33 | 100 |
| 45 | 150 |
| 47 | 170 |

EXAMPLE 52

Resin solution F is dispersed with 20 g of a polycondensation product prepared from 1 mol of 3-methoxy-diphenylamine-4-diazonium sulfate and 1 mol of 4,4'-bis-methoxymethyl-diphenyl ether, precipitated as methyl sulfonate, and is used as an electro dipping varnish. In the solution prepared in this manner, a grained and anodized aluminum sheet is anodically connected for 2 sec at 30 V. As a result, an imagewise coated plate is obtained, the coating of which is still light-sensitive (negative-working) and can be provided with an additional image pattern by normal exposure to ultraviolet light.

EXAMPLE 53

Resin solution B is dispersed with 20 g of a polycondensation product prepared from 1 mol of 3-methoxy-diphenylamine-4-diazonium sulfate and 1 mol of 4,4'-bis-methoxymethyl-diphenyl ether, precipitated as methyl sulfonate, and is used as an electro dipping varnish. In the solution prepared in this manner, a grained and anodized aluminum sheet is cathodically connected for 5 sec at 10 V. As a result, an imagewise coated plate is obtained, the coating of which is still light-sensitive (negative-working) and can be provided with an additional image pattern by normal exposure to ultraviolet light.

What is claimed is:

1. A process for the electrochemical image formation on an electrically conductive substrate by the action of electric current, comprising the steps of:
   contacting the substrate with an electrically conductive solution of an organic substance;
   applying a direct voltage between the substrate and at least one electrode;
   depositing said organic substance onto the substrate by current impulses, at a current density from about 0.01 to 100 $A/dm^2$.

2. A process as claimed in claim 1, wherein the organic substance comprises a polymer.

3. A process as claimed in claim 1, wherein the concentration of the organic substance is in the range from 0.1% by weight up to the saturation limit.

4. A process as claimed in claim 3, wherein the concentration is up to 20% by weight.

5. A process as claimed in claim 1, wherein the substance is deposited through a mask onto the substrate.

6. A process as claimed in claim 1, wherein a metal is used as the substrate.

7. A process as claimed in claim 6, wherein the metal comprises aluminum.

8. A process as claimed in claim 1, additionally comprising the step of treating the surface of the metal substrate, said treatment comprising at least one of graining and anodizing.

9. A process as claimed in claim 1, wherein said substrate comprises an imaged and developed substrate.

10. A process as claimed in claim 1, wherein the organic substance additionally comprises radiation-sensitive constituents.

11. A process as claimed in claim 1, wherein the pH of the electrically conductive solution is in the range from 2 to 1.

12. A process as claimed in claim 1, wherein the electrically conductive solution is used in the form of a gel that is spread on said substrate.

13. A process as claimed in claim 1, wherein the organic substance is deposited by means of at least one stylus electrode.

14. A process as claimed in claim 1, wherein said electrode is guided in response to digitally stored information.

15. A process as claimed in claim 14, wherein said digitally stored information corresponds to a printing form.

16. A process as claimed in claim 14, wherein said digitally stored information corresponds to a printed circuit pattern.

17. A process as claimed in claim 1, consisting essentially of the recited steps.

18. A process as claimed in claim 1, comprising a punctiform deposit of said organic compound.

19. A process as claimed in claim 1, comprising multiple electrodes.

20. A process as claimed in claim 1, wherein said substrate is the cathode.

21. A process as claimed in claim 1, wherein said substrate is the anode.

22. A process as claimed in claim 1, wherein said electrically conductive solution is an aqueous solution that is essentially free of organic solvents.

* * * * *